US008243957B2

(12) United States Patent
Li

(10) Patent No.: US 8,243,957 B2
(45) Date of Patent: Aug. 14, 2012

(54) AUDIO CONTROL APPARATUS

(75) Inventor: Ming-Chung Li, Taipei (TW)

(73) Assignee: Princeton Technology Corporation, Taipei County (TW)

( * ) Notice: Subject to any disclaimer, the term of this patent is extended or adjusted under 35 U.S.C. 154(b) by 1341 days.

(21) Appl. No.: 11/907,493

(22) Filed: Oct. 12, 2007

(65) Prior Publication Data

US 2009/0016546 A1 Jan. 15, 2009

(30) Foreign Application Priority Data

Jul. 13, 2007 (TW) .............................. 96211461 U

(51) Int. Cl.
*H03G 3/00* (2006.01)

(52) U.S. Cl. ....... 381/107; 381/94.1; 381/94.8; 381/104

(58) Field of Classification Search .................. 330/254; 381/104, 107, 123, 306, 94.1, 94.8
See application file for complete search history.

(56) References Cited

U.S. PATENT DOCUMENTS

| | | | | |
|---|---|---|---|---|
| 4,818,951 | A * | 4/1989 | Roberts | 330/254 |
| 5,633,940 | A * | 5/1997 | Wassink | 381/107 |
| 7,519,190 | B2 * | 4/2009 | Lin et al. | 381/123 |
| 7,668,324 | B2 * | 2/2010 | Matsushita | 381/306 |

* cited by examiner

*Primary Examiner* — Kimberly Rizkallah
*Assistant Examiner* — Errol Fernandes
(74) *Attorney, Agent, or Firm* — Muncy, Geissler, Olds & Lowe, PLLC

(57) ABSTRACT

An audio control apparatus. The audio control apparatus comprises a processing module, an amplification module, and a control module. The processing module receives and processes an audio signal according to a control signal, and generates a processed signal. The amplification module coupled to the processing module, amplifies the processed signal to generate an output signal. The control module coupled to the processing module and the amplification module, receives the output signal to generate the control signal.

14 Claims, 5 Drawing Sheets

AUDIO CONTROL APPARATUS

BACKGROUND OF THE INVENTION

1. Field of the Invention

The invention relates in general to an audio control apparatus, and in particular, to an audio control apparatus to control an audio signal.

2. Description of the Related Art

Audio amplifiers exhibit clipping distortion during power amplification, resulting in noise from the speaker. To counter this problem, it is desirable to stop the power amplifiers from entering into the clipping distortion state, typically by limiting the amplitude of the input signal, or reducing the gain of the low power amplifiers.

FIG. 1 is a block diagram of a conventional amplitude limiter circuit. The audio control apparatus 10 in the conventional audio player system utilizes the voltage controlled amplifier 12 to limit signal amplitude. The gain from the voltage controlled amplifier 12 is modified by the control voltage $V_{trl}$ generated by the automatic level control unit 14. After amplifying the input audio signal, the amplified input audio signal is transmitted to the power amplifier 16 for amplification and then output by the speaker 18.

FIG. 2 is a block diagram of a voltage controller amplifier in a typical amplitude limiter. As indicated in FIG. 2, the voltage controlled amplifier (VCA) 12 basically comprises the differential amplifier 121 and the power supply 123. The voltage gain of the differential amplifier 121 is modified by changing the value of the current of the power supply 123. The automatic level control unit 14 is used for detecting the output amplitude of the voltage controlled amplifier 12. When the output amplitude exceeds a predetermined value, the automatic level control unit 14 decreases the gain of the voltage controlled amplifier 12, thereby limiting the output amplitude of the voltage controlled amplifier 12, preventing the power amplifier 16 from entering into the clipping distortion state.

However, the voltage controlled amplifier 12 has the following problems: due to the open loop operating condition, the distortion cannot be reduced, residual noise is high, and the dynamic range of the input signal and output signal are limited. Therefore, it is important to provide an audio control apparatus capable of limiting the amplitude of the input audio signal to solve the problems in conventional methods.

BRIEF SUMMARY OF THE INVENTION

A detailed description is given in the following embodiments with reference to the accompanying drawings.

An audio control apparatus is disclosed. The audio control apparatus comprises a processing module, an amplification module, and a control module. The processing module receives and processes an audio signal according to a control signal, and then generates a processed signal. The amplification module coupled to the processing module, amplifies the processed signal to generate an output signal. The control module coupled to the processing module and the amplification module, receives the output signal to generate the control signal.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
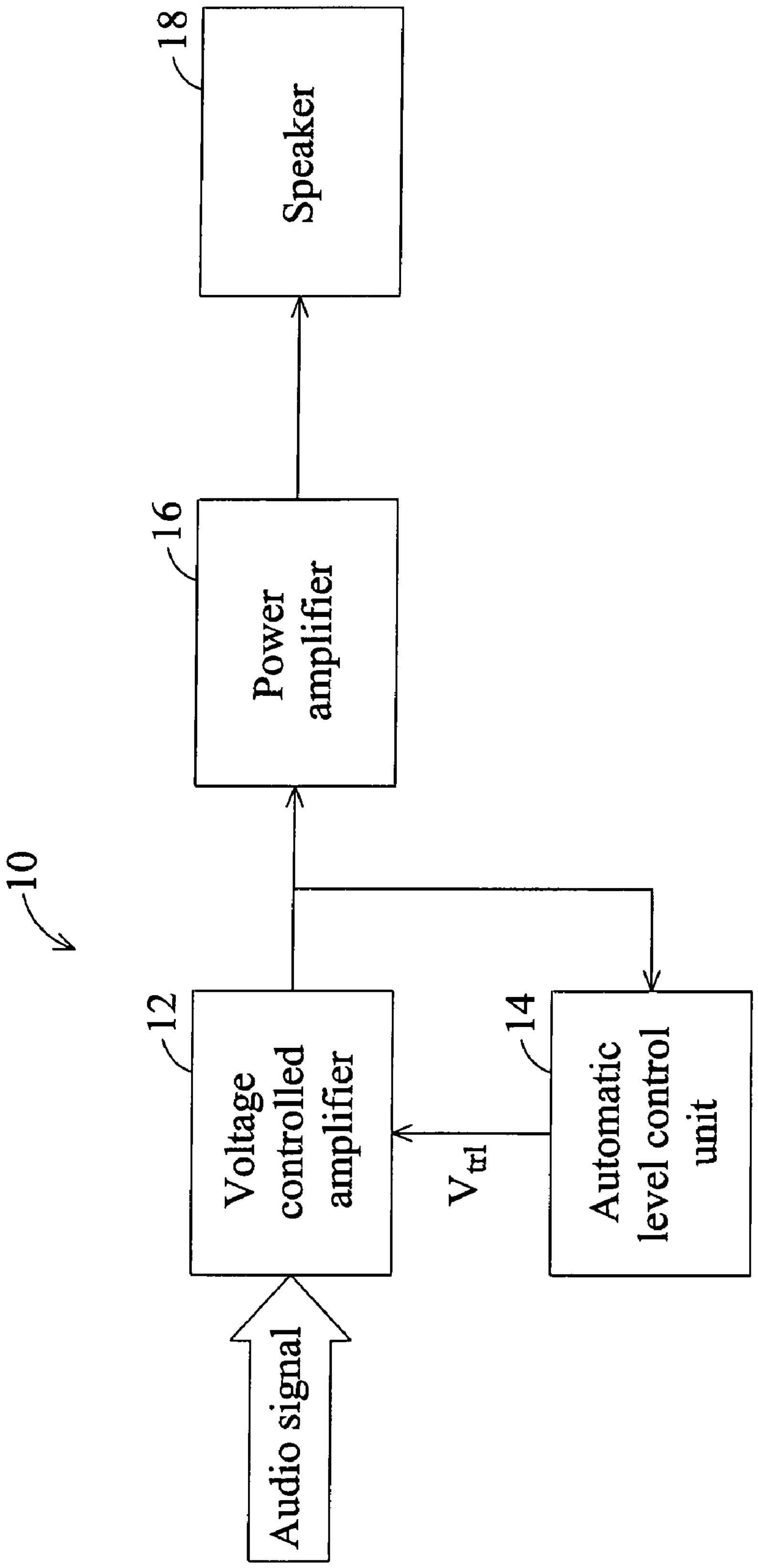
FIG. 1 is a block diagram of a conventional amplitude limiter circuit.
Figure 2:
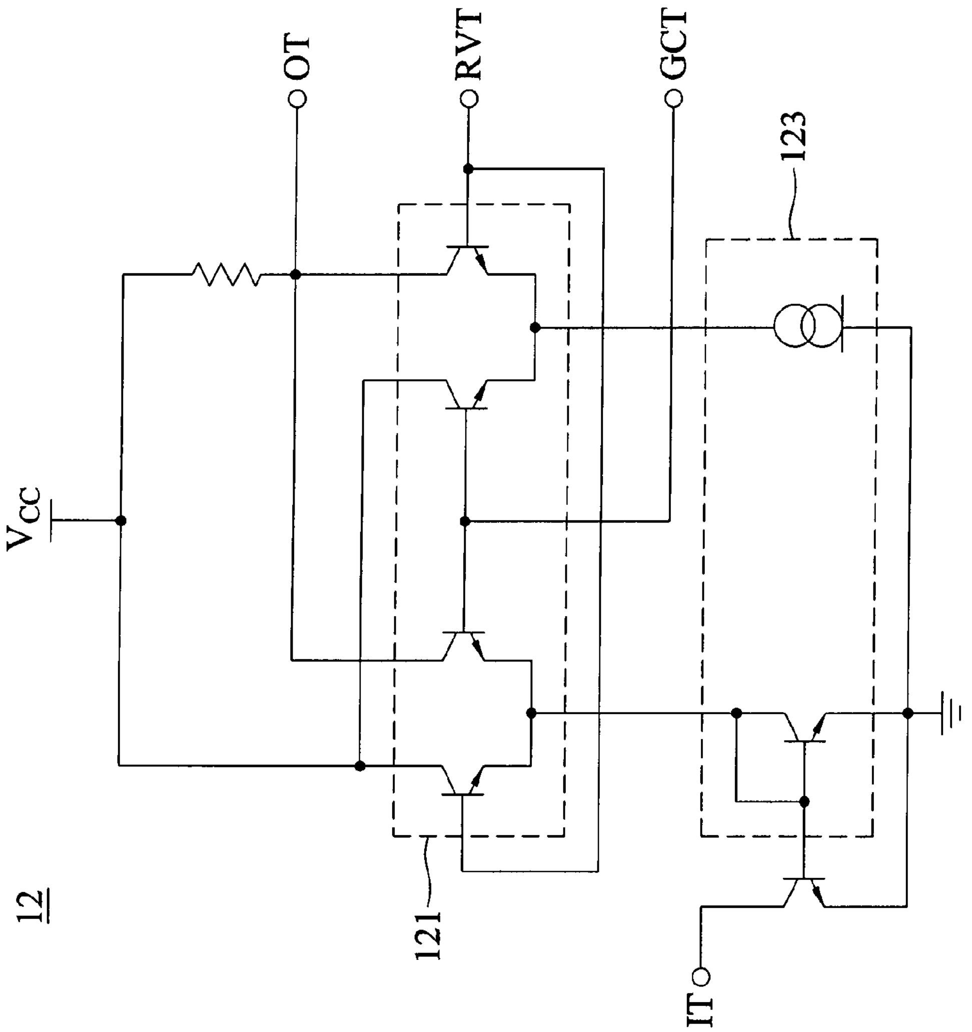
FIG. 2 is a block diagram of a voltage controller amplifier in a typical amplitude limiter.
Figure 3:
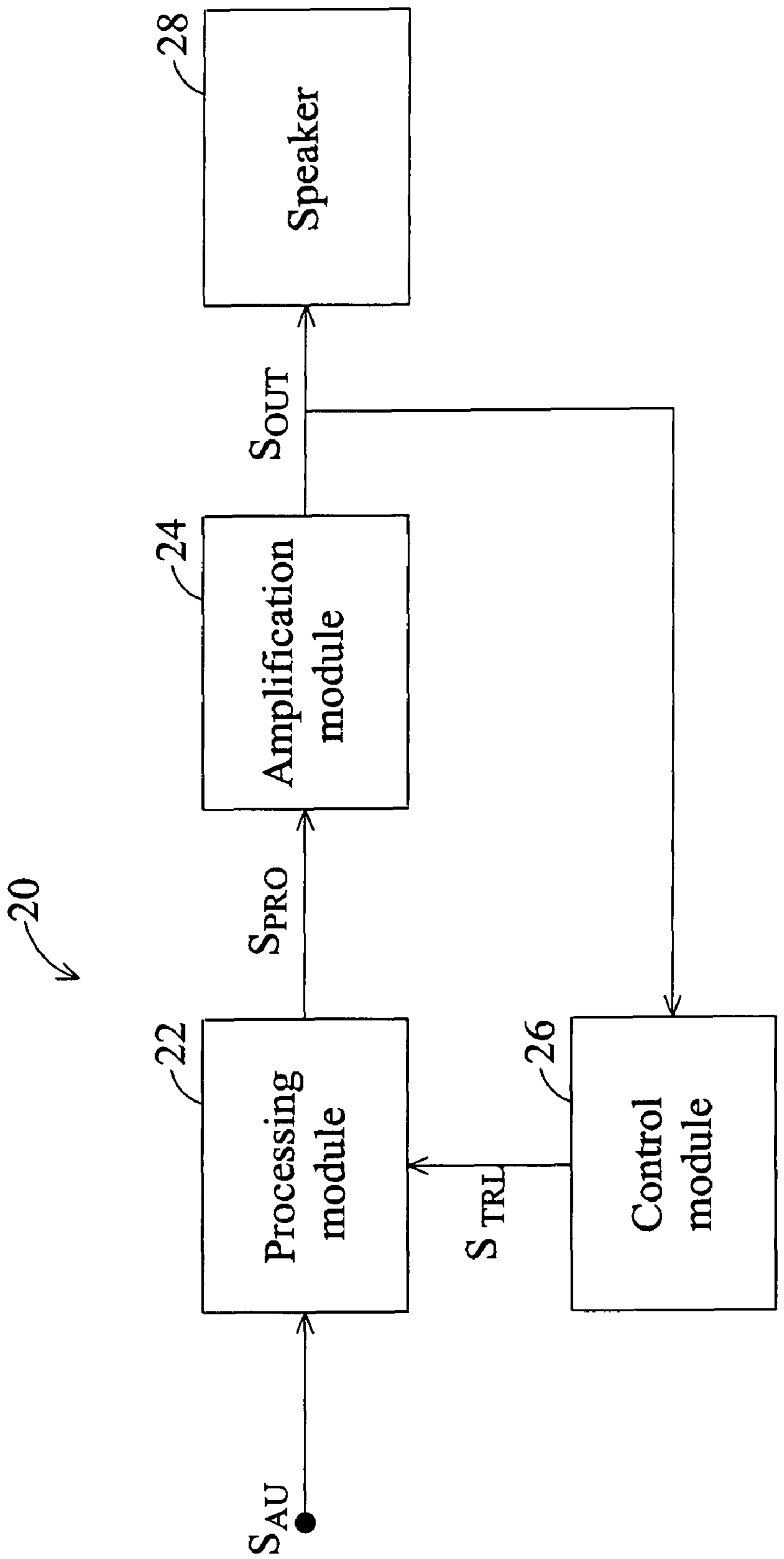
FIG. 3 is a block diagram of an exemplary audio control apparatus according to the invention.

FIG. 3 is a block diagram of an exemplary audio control apparatus according to the invention. As shown in FIG. 3, an audio control apparatus 20 comprises processing module 22, amplification module 24, and control module 26. The processing module 22 receives and processes an audio signal $S_{AU}$ according to a control signal $S_{TRL}$ to generate a processed signal $S_{PRO}$. The processing module 22 performs gain amplification on the audio signal $S_{AU}$ according to the control signal $S_{TRL}$ to generate the processed signal $S_{PRO}$. In some embodiments, the value of the processed signal $S_{PRO}$ is proportional to that of the control signal $S_{TRL}$, and the processing module 22 is an attenuator. The amplification module 24 is coupled to the processing module 22 for amplifying the processed signal $S_{PRO}$ to generate an output signal $S_{OUT}$. In some embodiments, the amplification module 24 is a power amplifier. The control module 26 is coupled to the processing module 22 and the amplification module 24 for receiving the output signal $S_{OUT}$ and generates the control signal $S_{TRL}$ according to the output signal $S_{OUT}$. Further, the audio control apparatus 20 also comprises a speaker 28, coupled to the amplification module 24, to output the sound of signal $S_{OUT}$.

Figure 4:
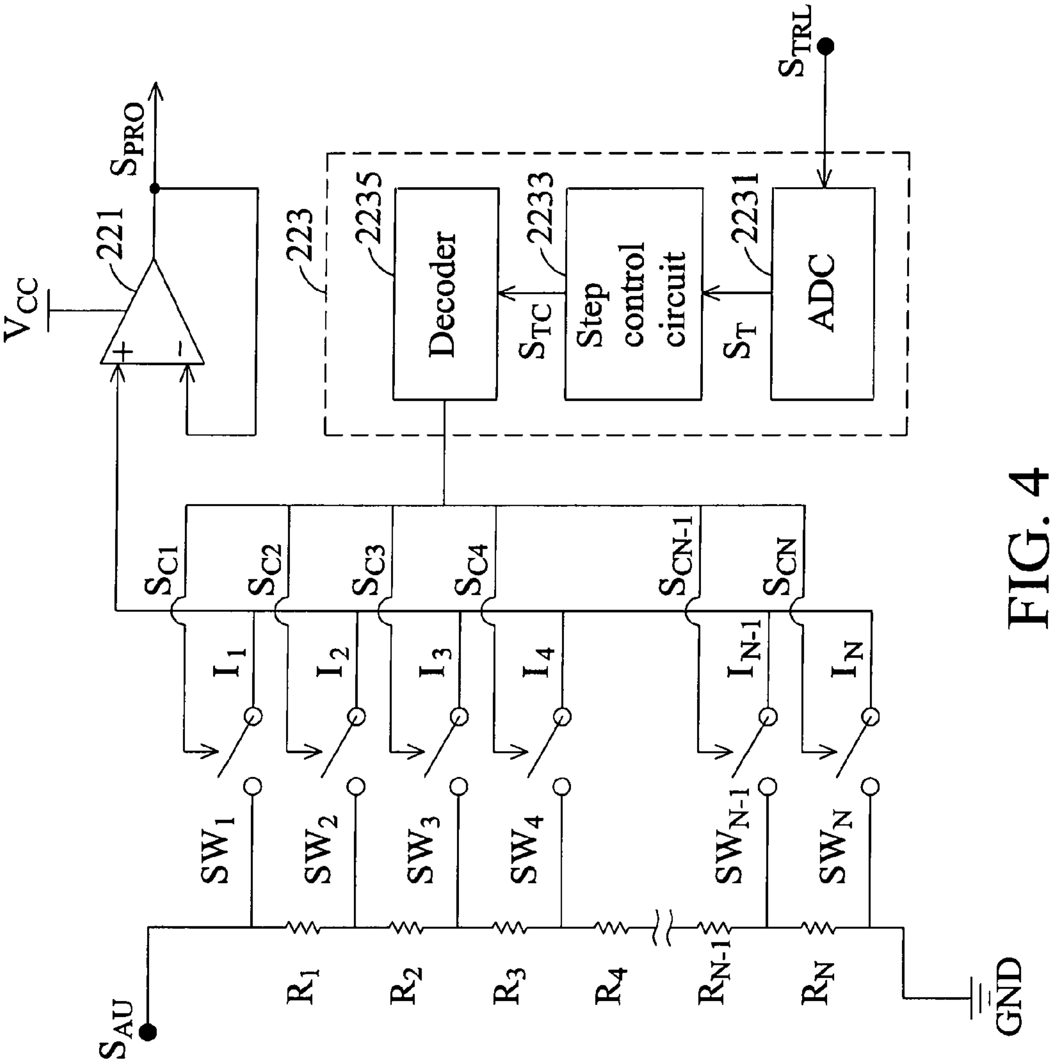
FIG. 4 is a block diagram of the processing module of the audio control apparatus according to the invention.

Please refer to FIGS. 3 and 4. FIG. 4 is a block diagram of the processing module of the audio control apparatus according to the invention. As shown in FIG. 3 and FIG. 4, the processing module 22 comprises a plurality of resistors $R_1$~$R_N$, a plurality of switches $SW_1$~$SW_N$, and an amplifier 221. The plurality of resistors $R_1$~$R_N$ are coupled in series to each other and a ground GND to receive the audio signal $S_{AU}$. Each of the plurality of switches $SW_1$~$SW_N$ has one end coupled to the plurality of resistors $R_1$~$R_N$, to selectively turn on and off the plurality of resistors $R_1$~$R_N$ for generating a plurality of currents $I_1$~$I_N$. The amplifier 221 is coupled to the other ends of the plurality of resistors $R_1$~$R_N$ to receive the plurality of currents $I_1$~$I_N$ and generate the processed signal $S_{PRO}$.

Further, the processing module 22 also comprises a switch control module 223 coupled between the control module 26 and the plurality of switches $SW_1$~$SW_N$. The switch control module 223 generates a plurality of switch control signals $S_{C1}$~$S_{CN}$ according to the control signal $S_{TRL}$. Wherein, the processing module 22 controls turning on and off of the plurality of resistors $R_1$~$R_N$ according to the plurality of switches $SW_1$~$SW_N$, to generate the plurality of currents $I_1$~$I_N$.

In one embodiment, the switch control module 223 comprises an analog-to-digital converter (ADC) 2231, a step control circuit 2233, and a decoder 2235. The analog-to-digital converter 2231 converts the control signal $S_{TRL}$ to a conversion signal $S_T$. The step control circuit 2233 is coupled to the analog-to-digital converter 2231 to generate a step control signal $S_{TC}$ according to the conversion signal $S_T$. The decoder 2235 is coupled to the step control circuit 2233 to perform decoding on the step control signal $S_{TC}$ to generate the plurality of switch control signals $S_{C1}$~$S_{CN}$.

Figure 5:
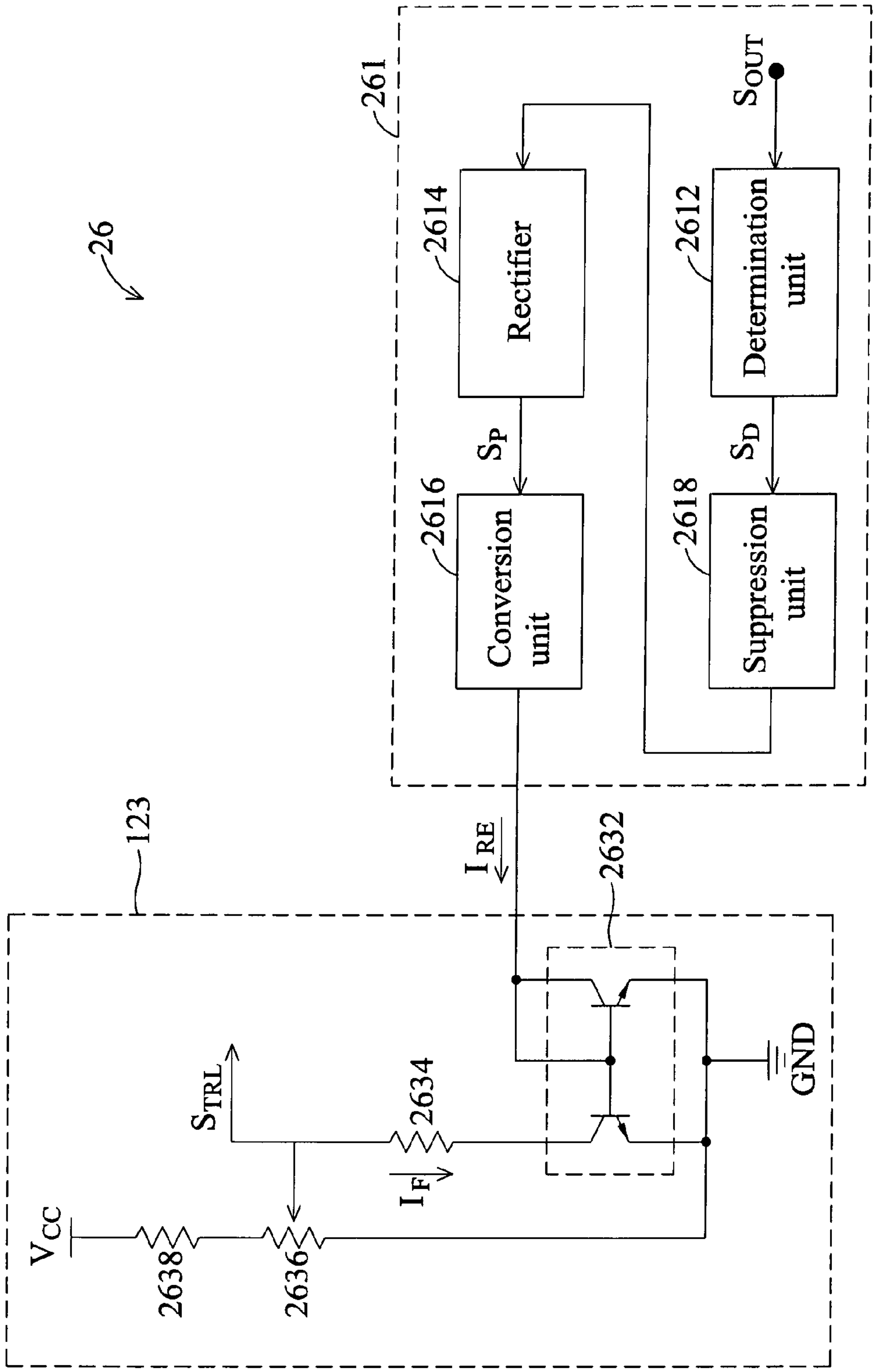
FIG. 5 is a block diagram of an exemplary control module of the audio control apparatus according to the invention.

Please refer FIG. 3 and FIG. 5. FIG. 5 is a block diagram of an exemplary control module of the audio control apparatus according to the invention. As shown in FIG. 3 and FIG. 5, the control module 26 comprises a receiving module 261 and a gain control module 263. The receiving module 261 converts the output signal $S_{OUT}$ to generate a receiving current $I_{RE}$. The gain control module 263 is coupled to the receiving module 261 to perform processing thereon and generate the control signal $S_{TRL}$ according to receiving current $I_{RE}$. In one embodiment, the receiving module 261 comprises a determination unit 2612, a rectifier unit 2614, and a conversion unit 2616. The determination unit 2612 receives the output signal $S_{OUT}$ and determines the value of the output signal $S_{OUT}$ to generate a determination signal $S_D$. The rectifier unit 2614 is coupled to the determination unit 2612 to perform rectification on the determination signal $S_D$ to generate a rectification signal $S_P$. The conversion unit 2616 is coupled to the rectifier unit 2614 for converting the rectification signal $S_P$ to the receiving current $I_{RE}$.

The gain control module 263 comprises a current mirror unit 2632, a first resistor 2634, and a second resistor 2636. The current mirror unit 2632 is coupled between the receiving module 261 and a ground GND to receive the receiving current $I_{RE}$. The first resistor 2634 has one end coupled to the current mirror unit 2632 to generate a first current $I_F$ according to the receiving current $I_{RE}$. The second resistor 2636 is coupled between a power supply $V_{CC}$ and the other end of the second resistor 2636 to generate the control signal $S_{TRL}$ according to the first current $I_F$.

In one embodiment, the second resistor 2636 is a variable resistor. The gain control module 263 adjusts the value of the control signal $S_{TRL}$ by changing the resistance of the second resistor 2636. Further, the gain control module 263 also comprises a third resistor 2638 coupled between the power supply $V_{CC}$ and the second resistor 2636. The receiving module 261 further comprises an attenuation unit 2618 coupled between the determination unit 2612 and the rectifier unit 2614 to configure the signal level for initiating the operation of the control module 26. In one embodiment, the attenuation unit 2618 is an attenuator. When the output signal $S_{OUT}$ is less than the signal level set by the attenuation unit 2618, the control module 26 remains idle, at which time receiving current $I_{RE}$ and first current $I_F$ is 0, the first resistor 2634 is disconnected, and the value of control signal $S_{TRL}$ is controlled by the voltage division formed by the second resistor 2636 and third resistor 2638. When the output signal $S_{OUT}$ equals or exceeds the signal level set by the attenuation unit 2618, the receiving current $I_{RE}$ start to increase, the current mirror unit 2632 is turned on, and the first resistor 2634 and second resistor 2636 are coupled in series, reducing the control signal $S_{TRL}$, thereby prevent the amplification module 24 from entering into the clipping distortion state.

In the disclosures according to the invention, the audio control apparatus utilizes the output signal generated by the amplification module to adjust the control signal, while correspondingly controlling the gain of the audio signal according to the control signal to generate the output signal. The invention avoids problems caused by the amplification module entering the clipping distortion state.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An audio control apparatus, comprising:

a processing module, receiving and processing an audio signal according to a control signal, and generating a processed signal;

an amplification module, coupled to the processing module, amplifying the processed signal to generate an output signal; and a control module, coupled to the processing module and the amplification module, receiving the output signal to generate the control signal, and comprising:

a receiving module, converting the output signal to generate a receiving current, and comprising:

a determination unit, receiving the output signal, and determining a magnitude of the output signal to generate a determination signal;

a rectifier unit, coupled to the determination unit, performing rectification on the determination signal to generate a rectification current; and a conversion unit, coupled to the rectifier unit, converting the rectification current to the receiving current; and a gain control module, coupled to the receiving module, generating the control signal according to the receiving current.

2. The audio control apparatus of claim 1, wherein the processing module amplifies the audio signal according to the control signal to generate the processed signal.

3. The audio control apparatus of claim 2, wherein the processed signal has a magnitude proportional to the control signal.

4. The audio control apparatus of claim 2, wherein the processing module comprises:

a plurality of resistors, coupled in serious to a ground, receiving the audio signal;

a plurality of switches, each coupled to the plurality of resistors with one end, electrically connecting and disconnecting with the resistors to generate a plurality of currents; and an amplifier, coupled to the other end of each switch, receiving the plurality of currents to generate the processed signal.

5. The audio control apparatus of claim 4, wherein the processing module further comprises:

a switch control module, coupled between the control module and the plurality of switches, generating a plurality of switch control signals according to the control signals;

wherein the processing module controls the plurality of switches selectively connecting and disconnecting according to the plurality of switch control signals to generate the plurality of currents.

6. The audio control apparatus of claim 5, wherein the switch control module comprises:

an analog-to-digital converter, converting the control signal to a conversion signal;

a step control circuit, coupled to the analog-to-digital converter, generating a step control signal according to the conversion signal; and a decoder, coupled to the step control circuit, decoding the step control signal to generate the plurality of switch control signals.

7. The audio control apparatus of claim 1, wherein the receiving module further comprises a suppression unit, coupled between the determination unit and the rectifier unit, configuring a signal level for the control module to operate.

8. The audio control apparatus of claim 7, wherein the suppression unit is an attenuator.

9. The audio control apparatus of claim 1, wherein the control device further comprises a speaker, coupled to the amplification module, outputting the output signal sound.

10. The audio control apparatus of claim 1, wherein the processing module is an attenuator.

11. The audio control apparatus of claim 1, wherein the amplification module is a power amplifier.

12. An audio control apparatus, comprising:

a processing module, receiving and processing an audio signal according to a control signal, and generating a processed signal;

an amplification module, coupled to the processing module, amplifying the processed signal to generate an output signal; and a control module, coupled to the processing module and the amplification module, receiving the output signal to generate the control signal, and comprising:

a receiving module, converting the output signal to generate a receiving current; and a gain control module, coupled to the receiving module, generating the control signal according to the receiving current, and comprising:

a current mirror unit, coupled to the receiving module and a ground, receiving the receiving current;

a first resistor, coupled to the current mirror unit with one end, generating a first current according to the receiving current; and a second resistor, coupled between a power supply and the other end of the first resistor, generating the control signal according to the first current.

13. The audio control apparatus of claim 12, wherein the second resistor is a variable resistor, and the gain control module adjusts the magnitude of the control signal by altering the resistance of the second resistor correspondingly.

14. The audio control apparatus of claim 12, wherein the gain control module further comprises a third resistor, coupled between the power supply and the second resistor.

* * * * *